United States Patent
Chang et al.

(10) Patent No.: US 10,879,797 B2
(45) Date of Patent: Dec. 29, 2020

(54) VOLTAGE BOOSTER CIRCUIT WITH RIPPLE CONTROL AND METHOD CONTROLLING SAME

(71) Applicant: eMemory Technology Inc., Hsin-Chu (TW)

(72) Inventors: Chia-Fu Chang, Hsinchu County (TW); Sung-Ling Hsieh, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 16/827,725

(22) Filed: Mar. 24, 2020

(65) Prior Publication Data

US 2020/0366193 A1 Nov. 19, 2020

Related U.S. Application Data

(60) Provisional application No. 62/847,246, filed on May 13, 2019.

(51) Int. Cl.
*H02M 3/07* (2006.01)
*H02M 1/14* (2006.01)

(52) U.S. Cl.
CPC .............. *H02M 3/07* (2013.01); *H02M 1/14* (2013.01)

(58) Field of Classification Search
None
See application file for complete search history.

(56) References Cited

U.S. PATENT DOCUMENTS

| 7,683,700 | B2 | 3/2010 | Huynh |
| 9,395,728 | B2 | 7/2016 | Chiu |
| 9,455,039 | B2 | 9/2016 | Lin |
| 10,249,346 | B2* | 4/2019 | Michael ................. G11C 16/12 |
| 10,644,497 | B2* | 5/2020 | Cheruiyot ........ H03K 17/08142 |
| 2002/0021611 | A1 | 2/2002 | Banba |
| 2009/0079495 | A1 | 3/2009 | Morita |
| 2020/0136502 | A1* | 4/2020 | Liu .......................... H02M 3/07 |

FOREIGN PATENT DOCUMENTS

| CN | 102044964 A | 5/2011 |
| CN | 104967306 A | 10/2015 |
| CN | 107240373 A | 10/2017 |
| JP | 2019-4681 A | 1/2019 |
| TW | 200536118 | 11/2005 |
| TW | 200634846 | 10/2006 |
| TW | 201344389 A | 11/2013 |

* cited by examiner

*Primary Examiner* — Jeffery S Zweizig
(74) *Attorney, Agent, or Firm* — Winston Hsu

(57) ABSTRACT

A voltage booster circuit includes a primary charge pump circuit, a secondary charge pump circuit and a transistor. The primary charge pump circuit is used to convert a supply voltage into a boosted voltage in response to a clock signal. The secondary charge pump circuit is used to convert the supply voltage into a regulated voltage in response to the clock signal. The transistor is coupled to the primary charge pump circuit and the secondary charge pump circuit, and has a control terminal receiving the regulated voltage, a first terminal receiving the boosted voltage and a second terminal outputting an output voltage.

19 Claims, 10 Drawing Sheets

VOLTAGE BOOSTER CIRCUIT WITH RIPPLE CONTROL AND METHOD CONTROLLING SAME

CROSS REFERENCE TO RELATED APPLICATIONS

This non-provisional application claims priority of U.S. patent application No. 62/847, 246, filed on 13 May, 2019, included herein by reference in its entirety.

BACKGROUND OF THE INVENTION

1. Field of the Invention

The invention relates to electronic circuits, and specifically, to a voltage booster circuit with ripple control and a method controlling the same.

2. Description of the Prior Art

In the applications of memory devices, e.g., NAND flash memory or NOR flash memory, a high voltage is essential to perform various memory operations. The high voltage is typically generated by pumping from a lower voltage using a charge pump circuit. The charge pump circuit operates in a charging phase or a regulating phase. In the charging phase, the charge pump circuit raises the output voltage to a target voltage level, and in the regulating phase, the charge pump circuit regulates the output voltage at the target voltage level. During the regulating phase, the charge pump circuit can produce variations in the output voltage, known as ripple. When adopting the charge pump circuit in a memory device, the ripple can cause the output voltage to exceed a maximum allowable voltage level, leading to damages to circuit components, or can cause the output voltage to drop below a minimum allowable voltage level, resulting in degradation of a programming operation.

Therefore, it is desirable to provide a voltage booster circuit with ripple control and a method controlling the same, providing an output voltage at a level sufficient to drive a load while reducing ripple in the output voltage.

SUMMARY OF THE INVENTION

In one embodiment, a voltage booster circuit includes a primary charge pump circuit, a secondary charge pump circuit and a transistor. The primary charge pump circuit is used to convert a supply voltage into a boosted voltage in response to a clock signal. The secondary charge pump circuit is used to convert the supply voltage into a regulated voltage in response to the clock signal. The transistor is coupled to the primary charge pump circuit and the secondary charge pump circuit, and has a control terminal receiving the regulated voltage, a first terminal receiving the boosted voltage and a second terminal outputting an output voltage.

In another embodiment, a method of controlling a voltage booster circuit including: a primary charge pump circuit converting a supply voltage into a boosted voltage in response to a clock signal; a secondary charge pump circuit converting the supply voltage into a regulated voltage in response to the clock signal; and a transistor receiving the regulated voltage at a control terminal, receiving the boosted voltage at a first terminal, and outputting an output voltage at a second terminal.

These and other objectives of the present invention will no doubt become obvious to those of ordinary skill in the art after reading the following detailed description of the preferred embodiment that is illustrated in the various figures and drawings.

DETAILED DESCRIPTION

Embodiments of a low-ripple voltage booster circuit are provided herein to convert an input DC voltage into a higher output DC voltage while reducing the magnitude of ripple (hereinafter referred to as a ripple voltage) of the output DC voltage in order to accommodate variations in drive capabilities of the voltage booster circuit owing to voltage and process variations. The output DC voltage may be used to program memory cells of a non-volatile memory device such as a NAND flash device or a NOR flash device.

Figure 1:
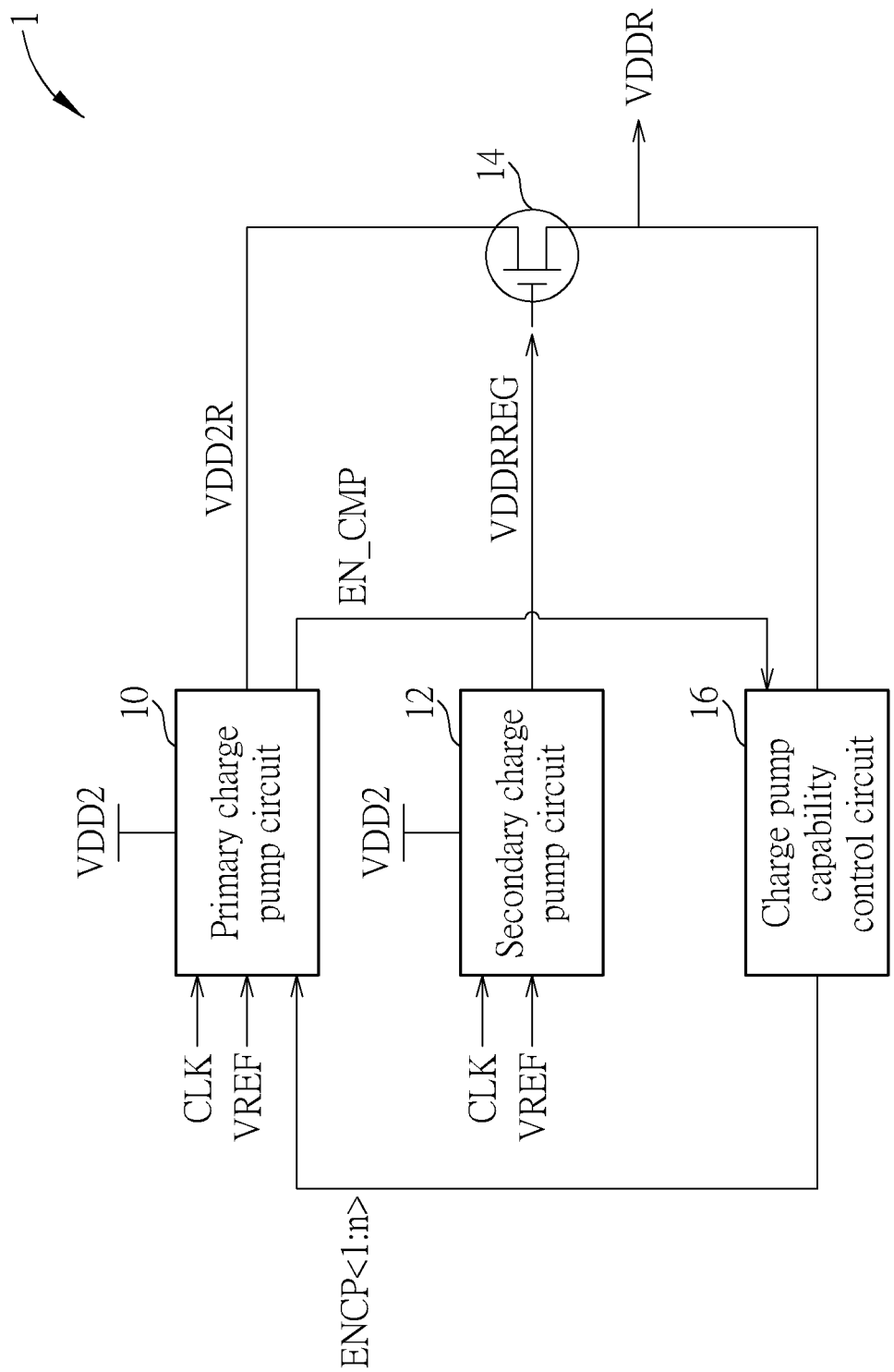
FIG. 1 is a block diagram of a voltage booster circuit according to an embodiment of the invention.

FIG. 1 is a block diagram of a voltage booster circuit 1 according to an embodiment of the invention. The voltage booster circuit 1 may boost a supply voltage VDD2 to generate an output voltage VDDR having a low ripple voltage. The output voltage VDDR may have a magnitude, e.g., 3.4V, exceeding that of the supply voltage VDD2, e.g., 2.2V to 2.8V. The voltage booster circuit 1 may employ a source follower or an emitter follower to smoothen ripples, and moreover, since the ripple voltage may be directly proportional to drive capability, the voltage booster circuit 1 may employ adjustable drive capability to configure the drive capability at a level just sufficient to drive a connected load, thereby reducing the ripple voltage in the output voltage VDDR. In some embodiments, the level of the drive capability may be determined in a predetermined program duration after power-on, e.g., 100 ns, so as to make the output voltage VDDR ready for a programming operation of a non-volatile memory device.

The voltage booster circuit 1 may comprise a primary charge pump circuit 10, a secondary charge pump circuit 12, a transistor 14 and a charge pump capability control circuit 16. The primary charge pump circuit 10 and the secondary charge pump circuit 12 are coupled to the transistor 14. The primary charge pump circuit 10 and the transistor 14 are coupled to the charge pump capability control circuit 16.

The primary charge pump circuit 10 may convert the supply voltage VDD2 into a boosted voltage VDD2R, e.g., 3.6V, in response to a clock signal CLK. The secondary charge pump circuit 12 may convert the supply voltage VDD2 into a regulated voltage VDDRREG, e.g., 3.35V, in response to the clock signal CLK. The clock signal CLK may have a predetermined period, e.g., 10 ns, and may be generated by a clock generator internally or externally to the primary charge pump circuit 10. The primary charge pump circuit 10 may have an adjustable primary drive capability directly related to an upper limit of an output current driving a load. In some embodiments, the primary charge pump circuit 10 may include a plurality of charge pump stages, and the primary drive capability is directly proportional to the number of the charge pump stages being selected. The secondary charge pump circuit 12 may have a relatively constant secondary drive capability. The secondary drive capability of the secondary charge pump circuit 12 may be less than the full drive capability of the primary charge pump circuit 10, and therefore, the ripple voltage in the regulated voltage VDDRREG may be less than those in the boosted voltage VDD2R.

The transistor 14 may be an N-type metal oxide semiconductor field effect (MOSFET) transistor or an N-type bipolar junction transistor (BJT), and may be arranged into a source follower configuration or an emitter follower configuration. In the embodiment, the transistor 14 may be a native NMOS transistor having a negative threshold voltage of The transistor 14 has a control terminal receiving the regulated voltage VDDRREG, a first terminal receiving the boosted voltage VDD2R and a second terminal outputting the output voltage VDDR. The transistor 14 may lock the output voltage VDDR substantially to the regulated voltage VDDRREG by a difference of the threshold voltage of the transistor 14. That is, the transistor 14 may deliver the output voltage VDDR at 3.4V, exceeding the regulated voltage VDDREG at 3.35V by 0.05V without suffering from a loss in voltage delivery capacity to the load. The primary charge pump circuit 10 may supply a current to the transistor 14 to establish the output voltage VDDR at the second terminal of the transistor 14. The boosted voltage VDD2R may be configured at a voltage level, e.g., 3.6V, higher than that of the output voltage VDDR, e.g., 3.4V. By employing the configuration, the ripple voltage in the output voltage VDDR may be considerably less than those in the boosted voltage VDD2R.

In addition, the primary charge pump circuit 10 and the charge pump capability control circuit 16 may together determine sufficient primary drive capability for a specified current load, e.g., 3 mA. In one embodiment, the charge pump capability control circuit 16 may simulate the specified current load by drawing a predetermined load current, e.g., 3 mA, from the second terminal of the transistor 14, then the primary charge pump circuit 10 may detect target ripples of the boosted voltage VDD2R, the target ripples being ripples oscillating about a reference voltage level, e.g., 3.6V. The primary charge pump circuit 10 may compare the boosted voltage VDD2R against the reference voltage level to generate a comparison signal EN_CMP indicative of detection of the target ripples. When the voltage of a ripple in the boosted voltage VDD2R oscillates once about the reference voltage level, the primary charge pump circuit 10 may generate a pulse in the comparison signal EN_CMP, indicating that a target ripple has been detected; and when the voltage of a ripple in the boosted voltage VDD2R oscillates about a voltage level different from the reference voltage level, e.g., 1.2V, or when the boosted voltage VDD2R is less than reference voltage level, the primary charge pump circuit 10 may generate no pulse in the comparison signal EN_CMP, indicating that no target ripple has been detected. Next, the charge pump capability control circuit 16 may receive the comparison signal EN_CMP from the primary charge pump circuit 10, determine a count of the target ripples in a predetermined duration, e.g., 640 ns, and generate a charge pump capability signal ENCP<1:n> according to the count of the target ripples to control the primary drive capability of the primary charge pump circuit 10, wherein n in the charge pump capability signal ENCP<1:n> is the highest level of the primary drive capability, e.g., 3. When the primary drive capability is insufficient to drive the specified current load, the boosted voltage VDD2R may drop below the reference voltage level and no target ripple of the boosted voltage VDD2R may be detected by the primary charge pump circuit 10; whereas when the primary drive capability is sufficient to drive the specified current load, the boosted voltage VDD2R may oscillate about the reference voltage level and the target ripples of the boosted voltage VDD2R may be detected by the primary charge pump circuit 10. In some embodiments, the drive capability determination may be started from the lowest level of the primary drive capability and gradually increased level by level, until the target ripples of the boosted voltage VDD2R can be detected, thereby identifying a sufficient level of the primary drive capability, while further suppressing the ripple voltage in the boosted voltage VDD2R.

Therefore, the voltage booster circuit 1 utilizes the transistor 14 and the charge pump capability control circuit 16 to reduce the ripple voltage in the output voltage VDDR while providing sufficient drive capability to drive the connected load.

Figure 2:
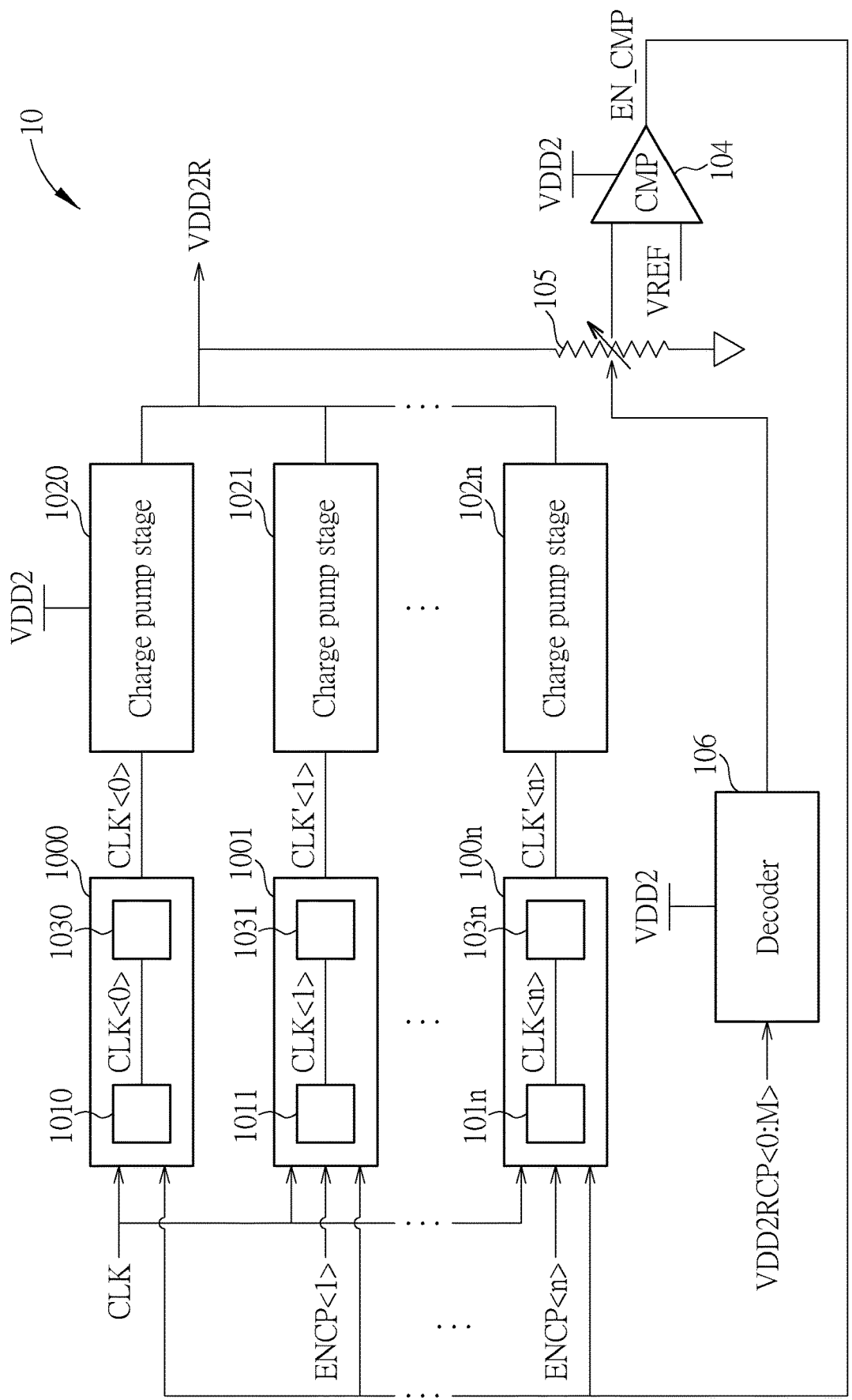
FIG. 2 is a block diagram of an exemplary primary charge pump circuit of the voltage booster circuit in FIG. 1.

FIG. 2 is a block diagram of an exemplary primary charge pump circuit 10 in FIG. 1, employing a clock signal CLK generated by an external clock generator. The primary charge pump circuit 10 may comprise a plurality of stage controllers 1000 to 100n, a plurality of charge pump stages 1020 to 102n, a comparator 104, a voltage divider 105 and a decoder 106, wherein n is a positive integer exceeding 1, e.g., n may be 4. The charge pump stages 1020 to 102n are coupled to each other. The stage controllers 1000 to 100n are coupled between the comparator 104 and the charge pump stages 1020 to 102n, respectively. In addition, the stage controllers 1001 to 100n are coupled to the charge pump capability control circuit 16. The charge pump stages 1020 to 102n and the decoder 106 are coupled to the voltage divider 105, which in turn is coupled to the comparator 104. The comparator 104 is further coupled to the stage controllers 1000 to 100n.

The charge pump stage 1020 may be selected by default to provide the lowest level of the primary drive capability. The primary charge pump circuit 10 may receive the charge pump capability signal ENCP<1:n> from the charge pump capability control circuit 16 to determine which of the charge pump stages 1021 to 102n is to be selected. In the embodiment, the stage controllers 1001 to 100n may receive the charge pump capability signal ENCP<1:n> to select the charge pump stages 1021 to 102n, respectively, so as to provide multiple levels of the primary drive capability and generate the boosted voltage VDD2R. The primary charge pump circuit 10 may generate the comparison signal EN_CMP by the comparator 104 to control turning on and off of a selected number of the charge pump stages 1020 to 102n. The selected number of the charge pump stages 1020 to 102n are enabled when the comparison signal EN_CMP indicates that the boosted voltage VDD2R is less than the reference voltage level and disabled when the comparison signal EN_CMP indicates that the boosted voltage VDD2R exceeds the reference voltage level, so as to regulate the voltage level of the boosted voltage VDD2R.

Specifically, the voltage level of the boosted voltage VDD2R may be regulated by a feedback path including the voltage divider 105 and the comparator 104. The decoder 106 may receive a voltage division signal VDD2RCP<0:M> to configure a division ratio of the voltage divider 105, wherein M may be a positive integer, e.g., M may be 2. The division ratio may be configured to produce a desired level of the boosted voltage VDD2R. In one example, the decoder 106 may configure the voltage divider 105 to have a division ratio of 1:3, so as to scale down the boosted voltage VDD2R into a quarter portion thereof. The comparator 104 may compare the scaled portion of the boosted voltage VDD2R to a comparator reference voltage level VREF, e.g., 0.85V, to generate the comparison signal EN_CMP in one of two logic states, e.g., 1 and 0, so as to regulate the level of the boosted voltage VDD2R and detect the target ripples in the boosted voltage VDD2R. The comparison signal EN_CMP may be used to control enablement of the selected number of the charge pump stages 1020 to 102n and determine the count of target ripples in the boosted voltage VDD2R. In one example, the comparator 104 may compare a quarter portion of the boosted voltage VDD2R to the comparator reference voltage level VREF at 0.85V, output logic state '1' in the comparison signal EN_CMP when the quarter portion exceeds 0.85V, or output logic state '0' in the comparison signal EN_CMP when the quarter portion is less than 0.85V. In turn, the stage controllers 1001 to 100n may enable the selected number of the charge pump stages 1020 to 102n to bring the scaled portion to the comparator reference voltage level VREF upon receiving logic state '1' in the comparison signal EN_CMP, and disable the selected number of the charge pump stages 1020 to 102n to hold the scaled portion substantially at the comparator reference voltage level VREF upon receiving logic state '0' in the comparison signal EN_CMP. As a result, the feedback path may lock the voltage level of the boosted voltage VDD2R substantially to four times of the comparator reference voltage level VREF, or 3.4V.

The stage controllers 1000 to 100n may comprise a plurality of control logic circuits 1010 to 101n and a plurality of delays and buffers 1030 to 103n, respectively. The control logic circuit 1010 may receive the clock signal CLK and the comparison signal EN_CMP to generate a gated clock signal CLK<0>. The control logic circuits 1011 to 101n may receive the clock signal CLK, the comparison signal EN_CMP and the charge pump capability signal ENCP<1:n> to generate gated clock signals CLK<1> to CLK<n> respectively. Subsequently, the delays and buffers 1030 to 103n may control timings of enabling the respective charge pump stages 1020 to 102n by introducing no delay or some delays to the gated clock signals CLK<0>to CLK<n>. In some embodiments, the control logic circuit 1010 may include a 2-input NAND gate, receiving the clock signal CLK and the comparison signal EN_CMP to generate the gated clock signal CLK<0>. The control logic circuits 1011 to 101n may respectively include 3-input NAND gates, receiving the clock signal CLK, the comparison signal EN_CMP and the charge pump capability signal ENCP<1:n> to generate the gated clock signals CLK<1> to CLK<n>. In some embodiments, the delays and buffers 1030 to 103n may delay the gated clock signals CLK<0> to CLK<n> for different time durations and feed the delayed clock signals CLK' <0> to CLK' <n> to the respective charge pump stages 1020 to 102n at different points in time, thereby preventing a voltage spike from being produced in the supply voltage VDD2 and reducing noise generation. The time durations associated with the respective delays and buffers 1030 to 103n may be configured during factory manufacturing. In other embodiments, the delays and buffers 1030 to 103n may forward the gated clock signals CLK<0> to CLK<n> directly to the respective charge pump stages 1020 to 102n without delay.

Figure 3:
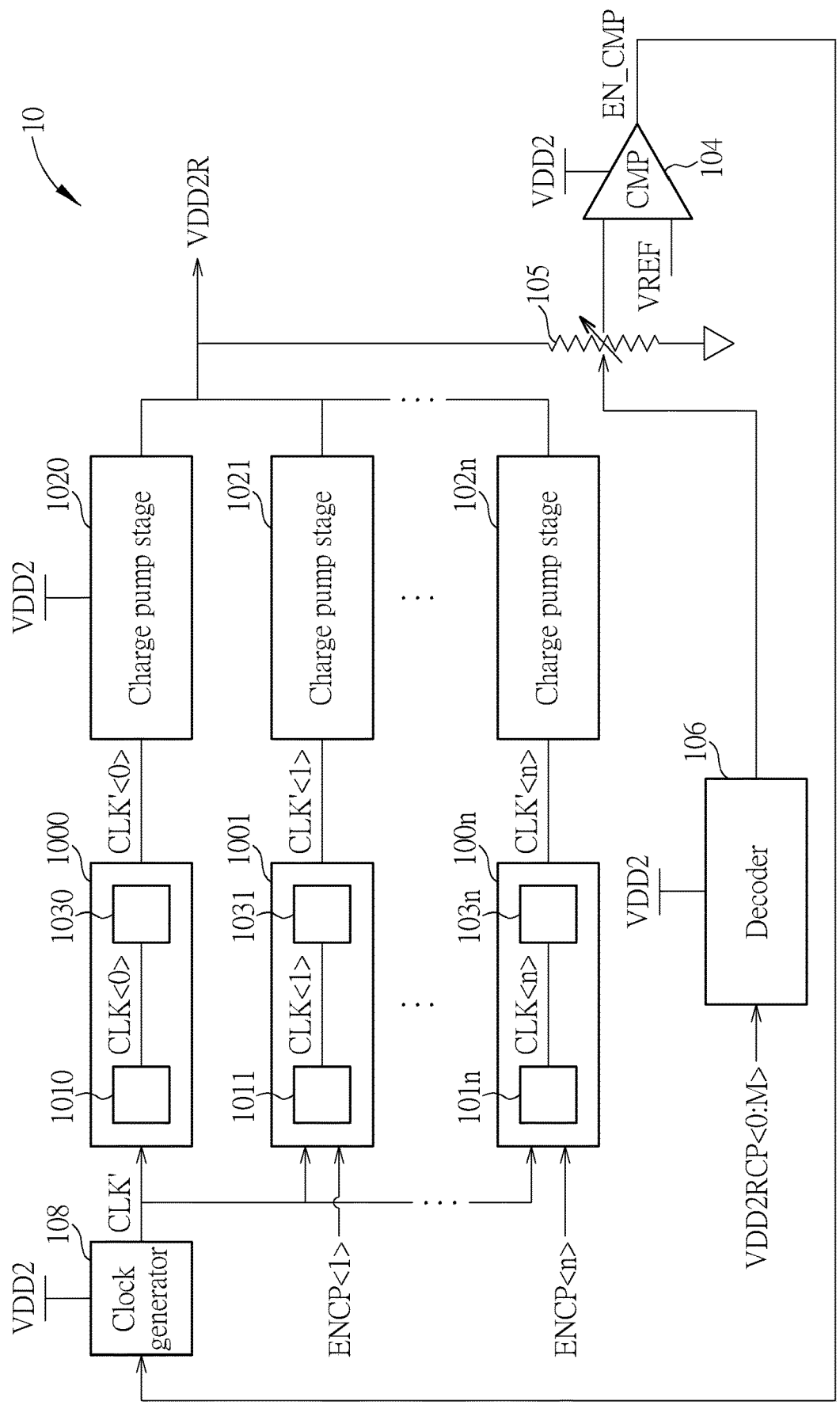
FIG. 3 is a block diagram of another exemplary primary charge pump circuit of the voltage booster circuit in FIG. 1.

FIG. 3 is a block diagram of another exemplary primary charge pump circuit 10, employing a clock signal CLK generated by an internal clock generator 108. The configuration of primary charge pump circuits 10 in FIGS. 2 and 3 are similar except that in FIG. 3, the primary charge pump circuit 10 may further comprise the internal clock generator 108, and the comparison signal EN_CMP may be fed to the internal clock generator 108, rather than the stage controllers 1000 to 100n, to generate a gated clock signal CLK'. The internal clock generator 108 may comprise an AND gate, receiving the comparison signal EN_CMP and the clock signal CLK to output the gated clock signal CLK'. The control logic circuit 1010 may forward the gated clock signal CLK' as the clock signal CLK<0>to the delay and buffer 1030. The control logic circuits 1011 to 101n may respectively include NAND gates, receiving the gated clock signal CLK' and the charge pump capability signal ENCP<1:n> to generate the clock signals CLK<1> to CLK<n>, and transmitting the clock signals CLK<1> to CLK<n> to the delays and buffers 1031 to 103n respectively. The configurations and operations of other components in FIG. 3 are similar to those in FIG. 2, and explanation therefor will be omitted for brevity.

Figure 4:
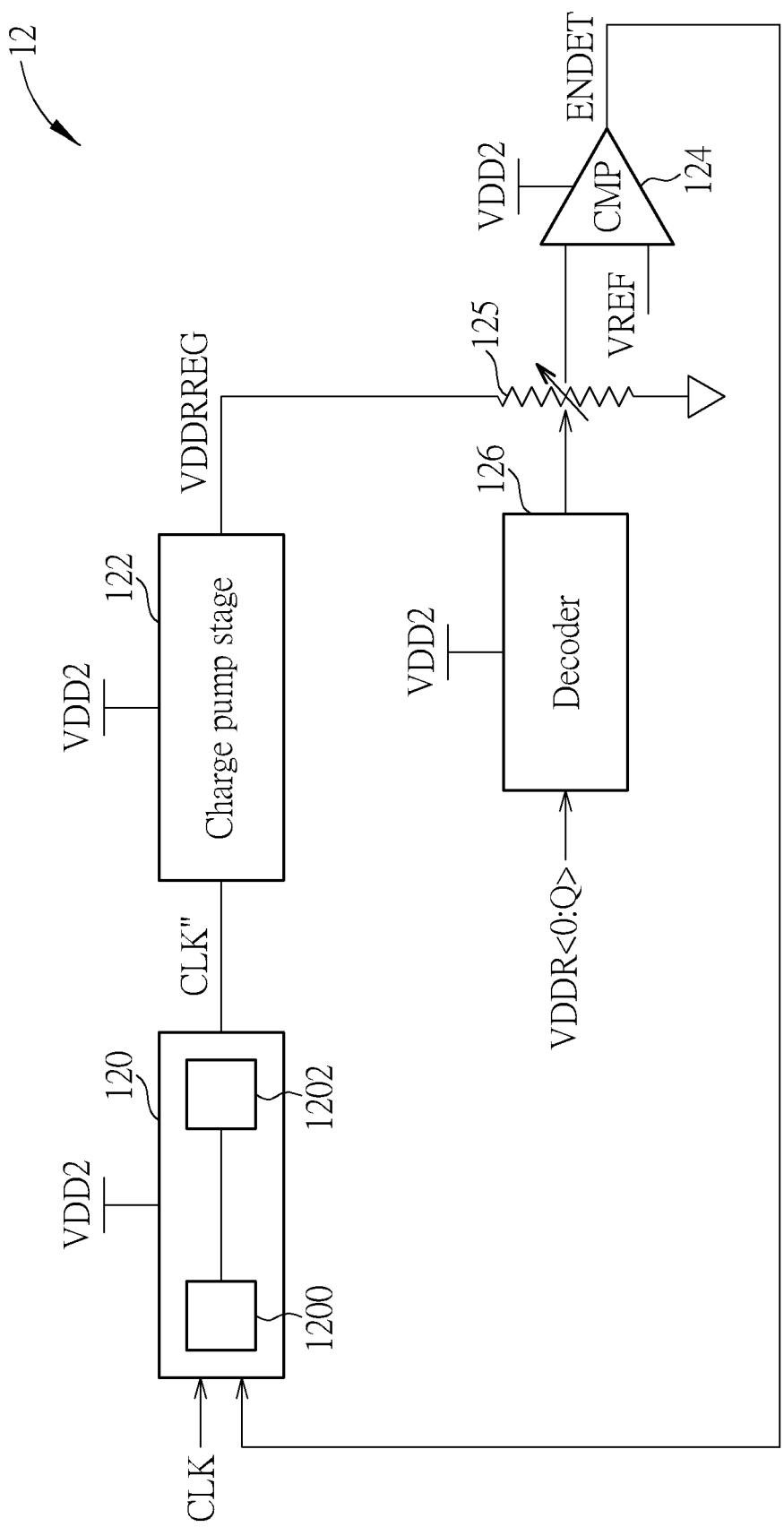
FIG. 4 is a block diagram of an exemplary secondary charge pump circuit of the voltage booster circuit in FIG. 1.

FIG. 4 is a block diagram of an exemplary secondary charge pump circuit 12. The secondary charge pump circuit 12 may comprise a buffer controller 120, a charge pump stage 122, a comparator 124, a voltage divider 125 and a decoder 126. The buffer controller 120 is coupled to the charge pump stage 122. The charge pump stage 122 and the decoder 126 are coupled to the voltage divider 125. The voltage divider 125 is coupled to the comparator 124. The comparator 124 is further coupled to the buffer controller 120. The secondary charge pump circuit 12 employs a single charge pump stage 122 to produce a low-ripple regulated voltage VDDRREG.

The buffer controller 120 may receive the clock signal CLK and a comparison signal ENDET and generate a gated clock signal CLK" according to the clock signal CLK and the comparison signal ENDET. The buffer controller 120 may comprise a control logic circuit 1200 and a buffer 1202. The control logic circuit 1200 may comprise a NAND gate, receiving the clock signal CLK and the comparison signal ENDET to generate the gated clock signal CLK". The buffer 1202 may forward the gated clock signal CLK" to the charge pump stage 122. The charge pump stage 122 may convert the supply voltage VDD2 into the regulated voltage VDDRREG in response to the gated clock signal CLK".

The decoder 126 may set a division ratio of the voltage divider 125 in accordance with a voltage division signal VDDR<0:Q>, wherein Q may be a positive integer, e.g., Q may be 2. The division ratio may be configured to produce a desired level of the regulated voltage VDDRREG. In some embodiments, the division ratio of the voltage divider 125 in the secondary charge pump circuit 12 may be set to be slightly less than that of the voltage divider 105 in the primary charge pump circuit 10, so as to produce the regulated voltage VDDRREG slightly less than the boosted voltage VDD2R. The voltage divider 125 may receive the regulated voltage VDDRREG to output a portion thereof to an input terminal of the comparator 124.

The comparator 124 may compare the portion of the regulated voltage VDDRREG to the comparator reference voltage level VREF, e.g., 0.85V, to generate the comparison signal ENDET in one of two logic states, e.g., 1 and 0, so as to regulate the level of the regulated voltage VDDRREG. When the portion of the regulated voltage VDDRREG is less than the comparator reference voltage level VREF, the charge pump stage 122 maybe enabled by the comparison signal ENDET to bring the regulated voltage VDDRREG towards the reference voltage level VREF, and when the portion of the regulated voltage VDDRREG exceeds the comparator reference voltage level VREF, and the charge pump stage 122 may be disabled by the comparison signal ENDET to maintain the regulated voltage VDDRREG substantially at the reference voltage level VREF.

Figure 5:
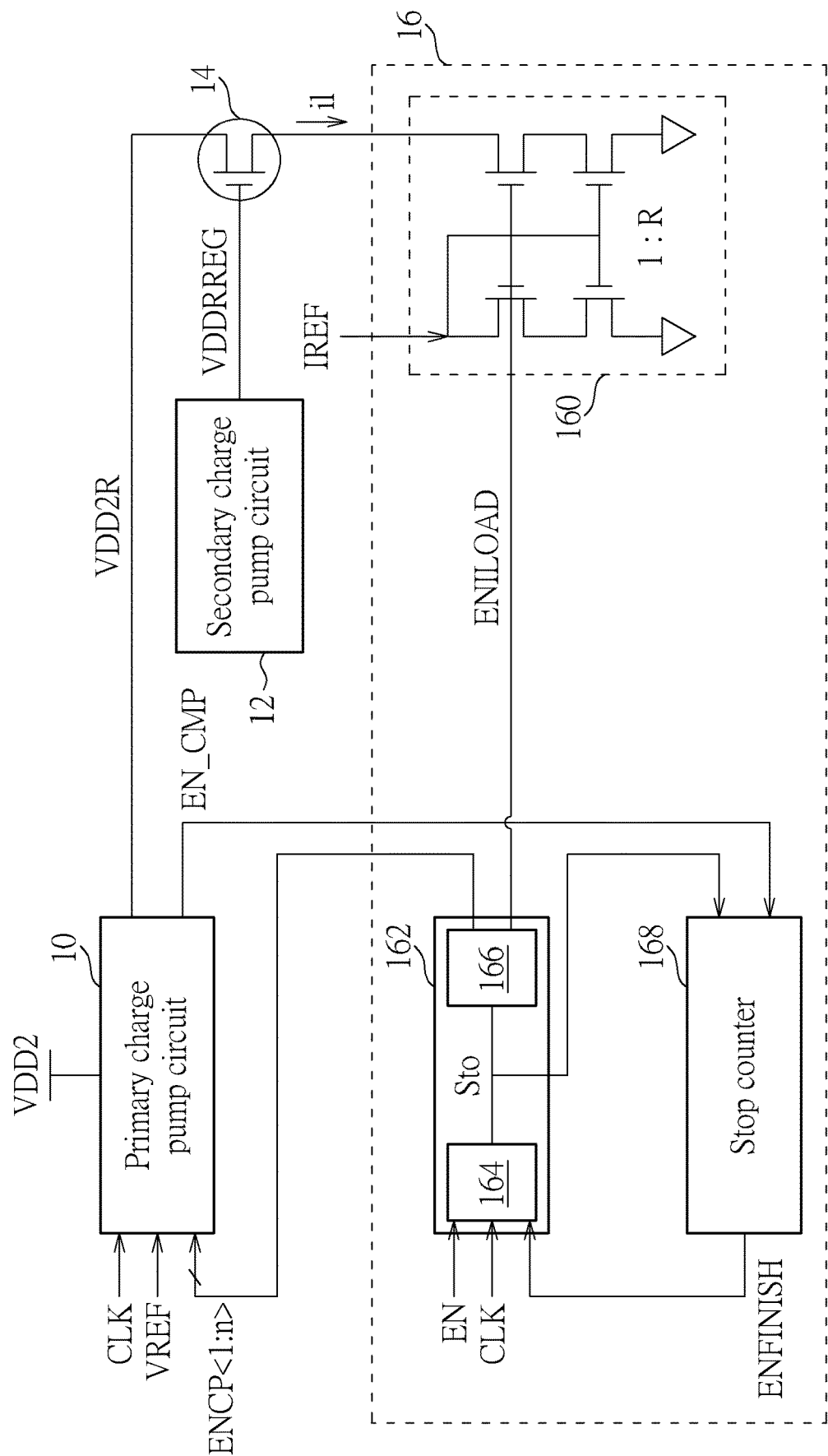
FIG. 5 is a block diagram of an exemplary charge pump capability control circuit of the voltage booster circuit in FIG. 1.

FIG. 5 is a block diagram of an exemplary charge pump capability control circuit 16. The charge pump capability control circuit 16 may comprise a current load 160, a time control circuit 162 and a stop counter 168. The time control circuit 162 may comprise a time counter 164 and a latch circuit 166. The current load 160 is coupled to the second terminal of the transistor 14. The time counter 164 is coupled to the latch circuit 166 and the stop counter 168. The latch circuit 166 is coupled to the primary charge pump circuit 10.

The time control circuit 162 may receive an enabling signal EN, the clock signal CLK, and a stop signal ENFINISH to measure an initialization duration, e.g., 640 ns, for generating current load enabling signal ENILOAD, and measure one or more predetermined durations, e.g., 640 ns, for generating the charge pump capability signal ENCP<1:n>. The initialization duration precedes the one or more predetermined durations in time. The time counter 164 may generate a timeout signal Sto indicative of expiries of the initialization duration and the predetermined durations, e.g., toggling the timeout signal Sto to logic state '1' to indicate the expiries. The predetermined duration may be adjustable to a time length supported by the time counter 164, e.g., a 6-bit counter may support a time length less than or equal to 64 time units, and the time unit may be the period of the clock signal CLK, e.g., 10 ns. The clock signal CLK may be generated by a clock source for producing the clock signals CLK adopted by the primary charge pump circuit 10 and the secondary charge pump circuit 12. The enabling signal EN may be set to logic state '1' by an external logic after the clock signal CLK is substantially stable. The stop signal ENFINISH may indicate that the boosted voltage VDD2R has been driven to near the reference voltage level.

The stop counter 168 may determine whether the count of the target ripples has reached a predetermined ripple count in the predetermined durations, so as to determine the sufficient primary drive capability of the primary charge pump circuit 10. In the embodiment, the stop counter 168 may receive the comparison signal EN_CMP and the timeout signal Sto to generate, upon the expiries of the predetermined durations, the stop signal ENFINISH when the count of the target ripples has reached the predetermined ripple count, e.g., 8. The comparison signal EN_CMP may indicate detection of the target ripples in the boosted voltage VDD2R, and the timeout signal Sto may indicate the expiries of the one or more predetermined duration. For example, the stop counter 168 may set logic state '1' in the stop signal ENFINISH upon detecting 8 target ripples in the boosted voltage VDD2R in 640 ns, and set logic state '0' in the stop signal ENFINISH upon detecting no target ripple in the boosted voltage VDD2R in 640 ns. The predetermined ripple count may be adjustable, a small predetermined ripple count, e.g., 1 may lead to a false detection resulting from a random voltage spike in the boosted voltage VDD2R, a large predetermined ripple count, e.g., 16 may result in a long detection period.

After enabled, the latch circuit 166 may receive the timeout signal Sto to generate a current load enabling signal ENILOAD upon the expiry of the initialization duration, e.g., 640 ns. The initialization duration is selected to allow the primary charge pump circuit 10 to generate a stable boosted voltage VDD2R using the lowest level of the primary drive capability. Later, the latch circuit 166 may update the charge pump capability signal ENCP<1:n> upon the expiries of the predetermined durations. The expiries of the initialization duration and the predetermined durations may be indicated by the timeout signal Sto. If the count of the target ripples has not reached the predetermined ripple count upon the expiries of the predetermined durations, the latch circuit 166 may update the charge pump capability signal ENCP<1:n> to sequentially increase the primary drive capability of the primary charge pump circuit 10 until the highest level of the primary drive capability, e.g., 3 has reached. If the count of the target ripples has reached the predetermined ripple count upon the expiry of one of the predetermined durations, the latch circuit 166 may hold the previously updated value of the charge pump capability signal ENCP<1:n> as the primary drive capability sufficient for driving the load.

The current load 160 may receive the current load enabling signal ENILOAD and a reference current IREF, e.g., 20 uA, and may be enabled by the current load enabling signal ENILOAD to draw a predetermined load current il, e.g. 3 mA, from the second terminal of the transistor 14, thereby simulating a specified current load driven by the voltage booster circuit 1. In the embodiment, the current load 160 may be implemented in the form of a current mirror circuit having a current transfer ratio of 1:R, R being an integer greater than 1, e.g., R may be 150.

Figure 6:
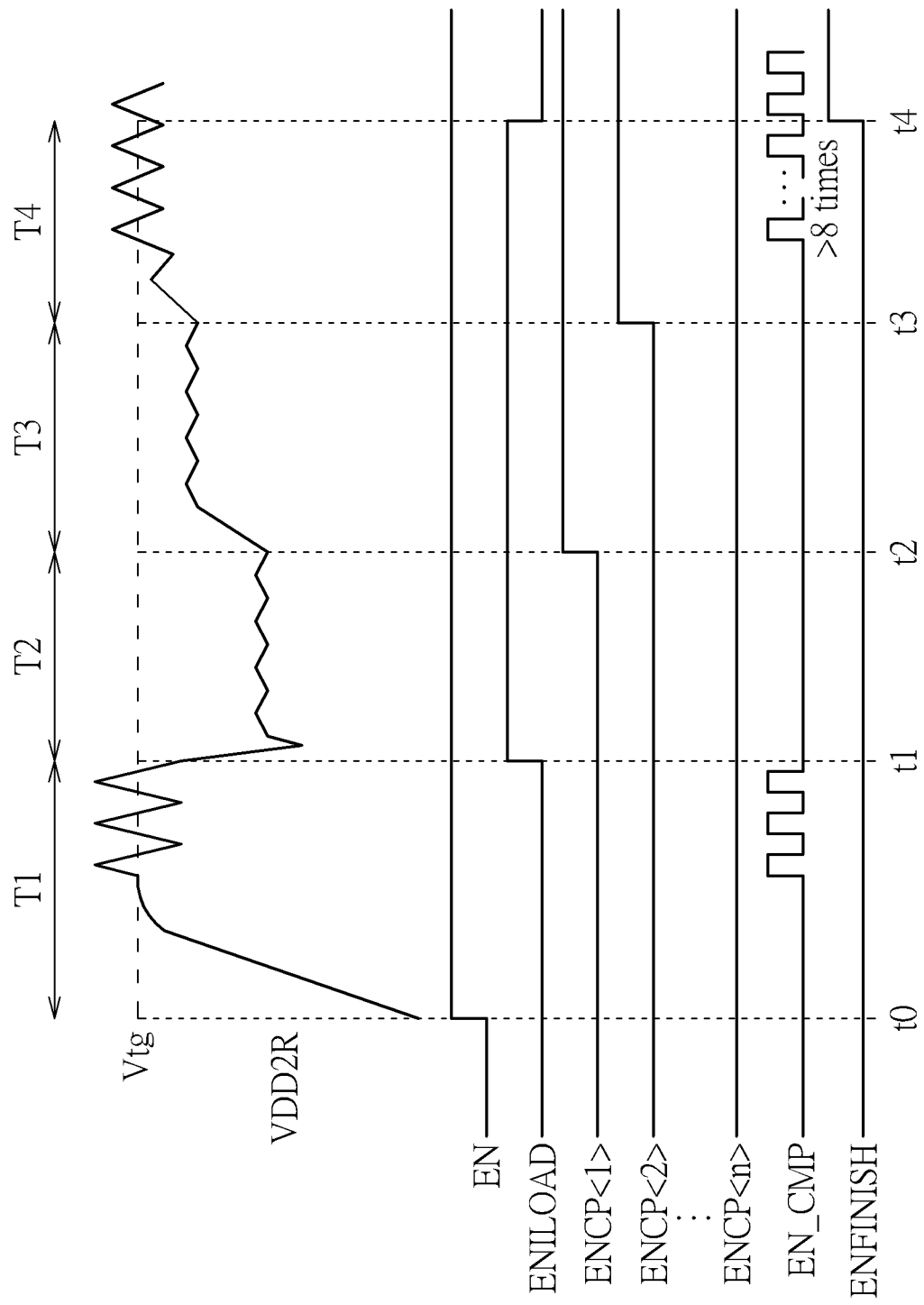
FIG. 6 is a timing diagram of selected signals in the charge pump capability control circuit in FIG. 5.

FIG. 6 is a timing diagram of selected signals in the charge pump capability control circuit 16 in FIG. 5. The timing diagram starts at time t0 with the enabling signal EN at logic state '1' while the current load enabling signal ENILOAD, the charge pump capability signal ENCP<1:n>, the comparison signal EN_CMP and the stop signal ENFINISH are at logic state '0'. Initially, upon detecting the enabling signal EN is set to logic state '1', the time counter 164 starts counting an initialization duration T1, the first charge pump stage 1020 is selected by default to drive up the boosted voltage VDD2R until reaching the reference voltage level Vtg, and therefore pulses in the comparison signal EN_CMP indicate detection of the target ripples, each pulse indicating detection of a target ripple. At time t1, the time counter 164 starts counting a predetermined duration T2, and the latch circuit 166 sets the current load enabling signal ENILOAD to logic state '1', causing the current load 160 to draw the predetermined load current from the second terminal of the transistor 14 and resulting in a voltage drop in the boosted voltage VDD2R. As a result, no target ripple is indicated in the comparison signal EN_CMP in the predetermined duration T2. At time t2, the time counter 164 starts counting the predetermined duration T3, and since no target ripple is detected in the predetermined duration T2, the latch circuit 166 sets the charge pump capability bit ENCP<1> to logic state '1' to select the charge pump stage 1021, driving up the boosted voltage VDD2R. The boosted voltage VDD2R is still less than the reference voltage level Vtg, thus no target ripple is indicated in the comparison signal EN_CMP. At time t3, the time counter 164 again counts the predetermined duration T4, and since no target ripple is detected in the preceding predetermined duration T3, the latch circuit 166 sets the charge pump capability bit ENCP<2> to logic state '1' to further select the charge pump stage 1022, driving up the boosted voltage VDD2R. At this stage the boosted voltage VDD2R has reached the reference voltage level Vtg, the primary charge pump circuit 10 generates pulses in the comparison signal EN_CMP to indicate detection of the target ripples, and the stop counter 168 determines whether a count of the target ripples has reached the predetermined ripple count of 8. At time t4, the stop counter 168 sets the stop signal ENFINISH to logic state '1' upon detecting the count of the target ripples having reached 8, the time counter 164 stops counting, the load enabling signal ENILOAD to logic state '1' is set to logic state '0', the charge pump capability bits ENCP<1> and ENCP<2> are held at logic state '1', the charge pump capability bits ENCP<3> to ENCP<n> are held at logic state '0', resulting in the charge pump stages 1020 to 1022 being selected while the charge pump stages 1023 to 102n being unselected. The durations T1 to T4 may be identical to or different from each other, and in the case of identical durations, the initialization duration T1 and the predetermined durations T2 to T4 may be 640 ns. The last predetermined duration T4 may be shortened upon detecting that the count of the target ripples in the boosted voltage VDD2R has reached the predetermined ripple count.

Figure 7:
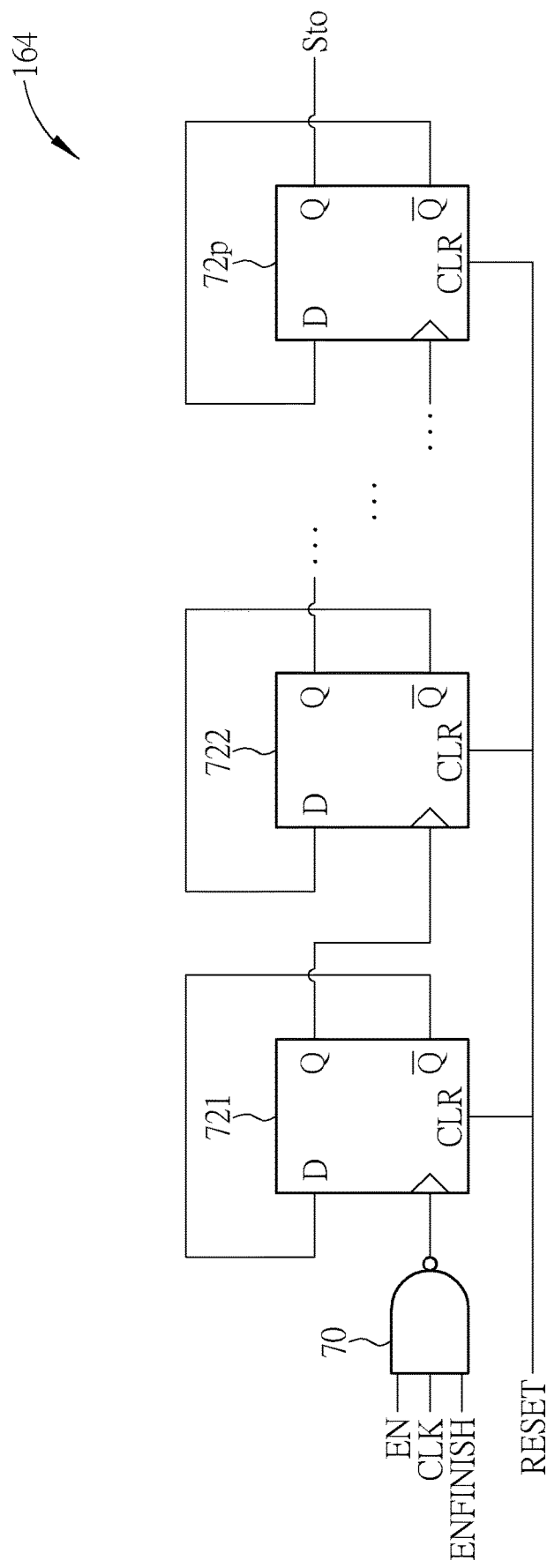
FIG. 7 is a circuit diagram of an exemplary time counter of the charge pump capability control circuit in FIG. 5.

FIG. 7 is a circuit diagram of an exemplary time counter 164 in FIG. 5, comprising a 3-input NAND gate 70 and flip-flops 721 to 72p, being an integer greater than 1. The 3-input NAND gate 70 is coupled to the flip-flop 721. The flip-flops 721 to 72p are coupled in cascade.

The 3-input NAND gate 70 may receive the enabling signal EN, the clock signal CLK, and the stop signal ENFINISH to generate a gated clock signal. The flip-flops 721 to 72p are sequentially coupled in a ripple counter configuration to proceed a count sequence for every clock cycle of the gated clock signal and generating the timeout signal Sto indicative of the expiry of the initialization duration and the expiries of the predetermined durations. In some embodiments, the flip-flops 721 to 72p may generate signal transitions in the timeout signal Sto upon the expiries of the initialization duration and the predetermined durations. The count sequence may be a counting-up or counting-down sequence. The flip-flops 721 to 72p may be reset by a reset signal RESET.

Figure 8:
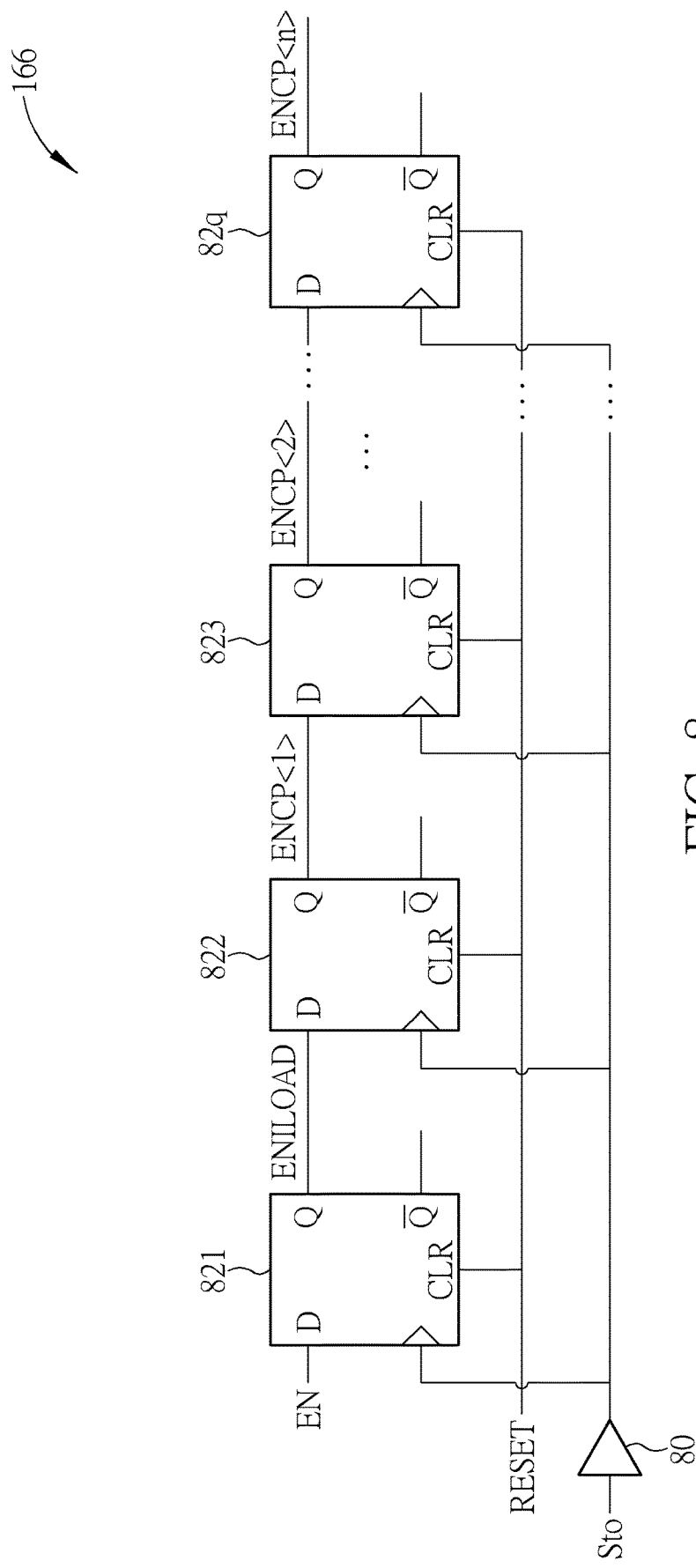
FIG. 8 is a circuit diagram of an exemplary latch circuit of the charge pump capability control circuit in FIG. 5.

FIG. 8 is a circuit diagram of an exemplary latch circuit 166 in FIG. 5, comprising a buffer 80 and latches 821 to 82q, q being an integer greater than 1. The buffer 80 is coupled between the flip-flop 72p and the latch 821. The latches 821 to 82q are coupled in cascade.

The latches 821 to 82q may be cascading flip-flops arranged in a shift register configuration, and each latch may sequentially propagate logic state '1' to the next latch upon a transition edge of the timeout signal Sto. The latch 821 may set the current load enabling signal ENILOAD to logic state '1' upon the first transition edge of the timeout signal Sto, the latches 822 to 82q may sequentially set the charge pump capability signals ENCP<1> to ENCP<n> to logic state '1' upon each subsequent transition edge of the timeout signal Sto. The latches 821 to 82q may be reset by the reset signal RESET.

Figure 9:
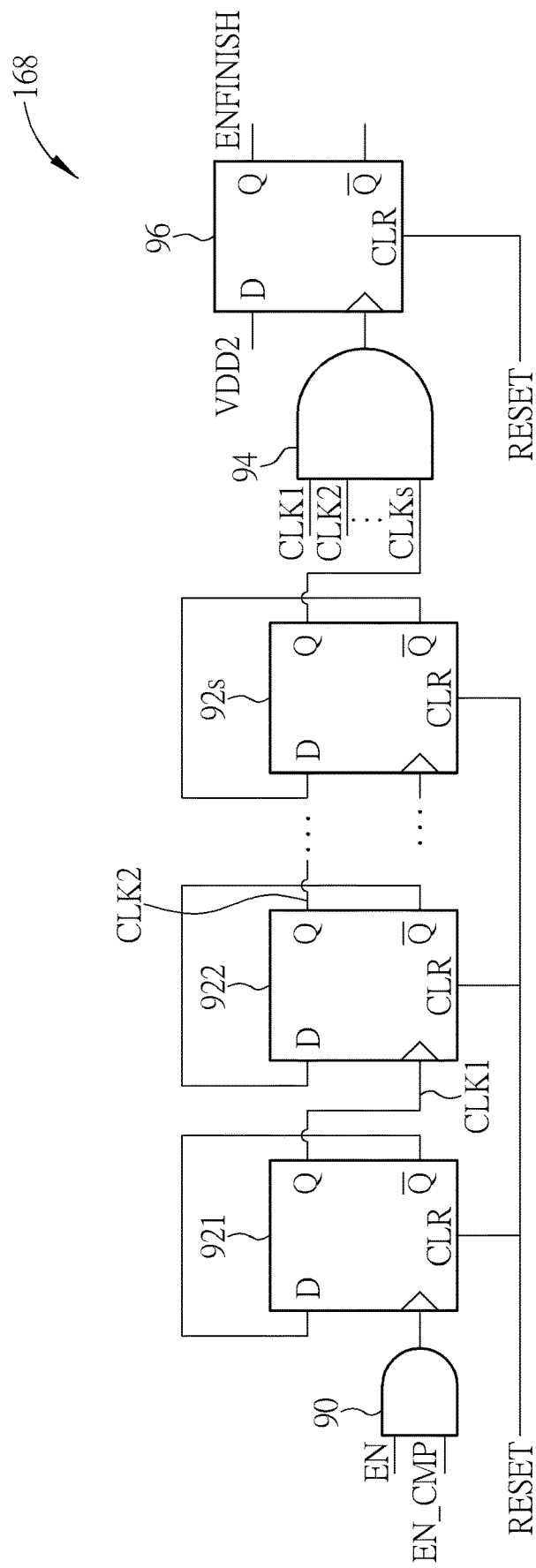
FIG. 9 is a circuit diagram of an exemplary stop counter of the charge pump capability control circuit in FIG. 5.

FIG. 9 is a circuit diagram of an exemplary stop counter 168 in FIG. 5. The stop counter 168 may comprise a 2-input AND gate 90, flip-flops 921 to 92s, an AND gate 94 and a flip-flop 96, s being an integer greater than 1. The 2-input AND gate 90 is coupled to the flip-flop 921. The flip-flops 921 to 92s are coupled in cascade. The flip-flop 92s is coupled to the AND gate 94. The AND gate 94 is coupled to the flip-flop 96. The stop counter 168 may generate the stop signal ENFINISH indicating whether the count of the target ripple has reached the predetermined ripple count.

The AND gate 90 may receive the enabling signal EN and the comparison signal EN_CMP to generate a first AND output signal. The flip-flops 921 to 92s are sequentially coupled in a ripple counter configuration, proceeding a count sequence upon each predetermined transition edge of the first AND output signal to generate the count of the target ripples. The count sequence may be a counting-up or a counting-down sequence. The predetermined transition edge may be a rising edge or a falling edge. The flip-flops 921 to 92s may receive the timeout signal Sto from the time counter 164 to serve as a reset signal RESET, and may be reset by the reset signal RESET. The AND gate 94 may receive outputs of the flip-flops 921 to 92s to determine whether the count of the target ripples has reached the predetermined ripple count of 8, and if so, set a second AND output signal to logic state '1'. In some embodiments, the AND gate 94 may be replaced with other combinational logic circuits to provide other values of the predetermined ripple count, e.g., 6. Upon detecting a positive edge transition of the second AND output signal from the AND gate 94, the flip-flop 96 may flag the stop signal ENFINISH by setting the stop signal ENFINISH to logic state '1'.

Figure 10:
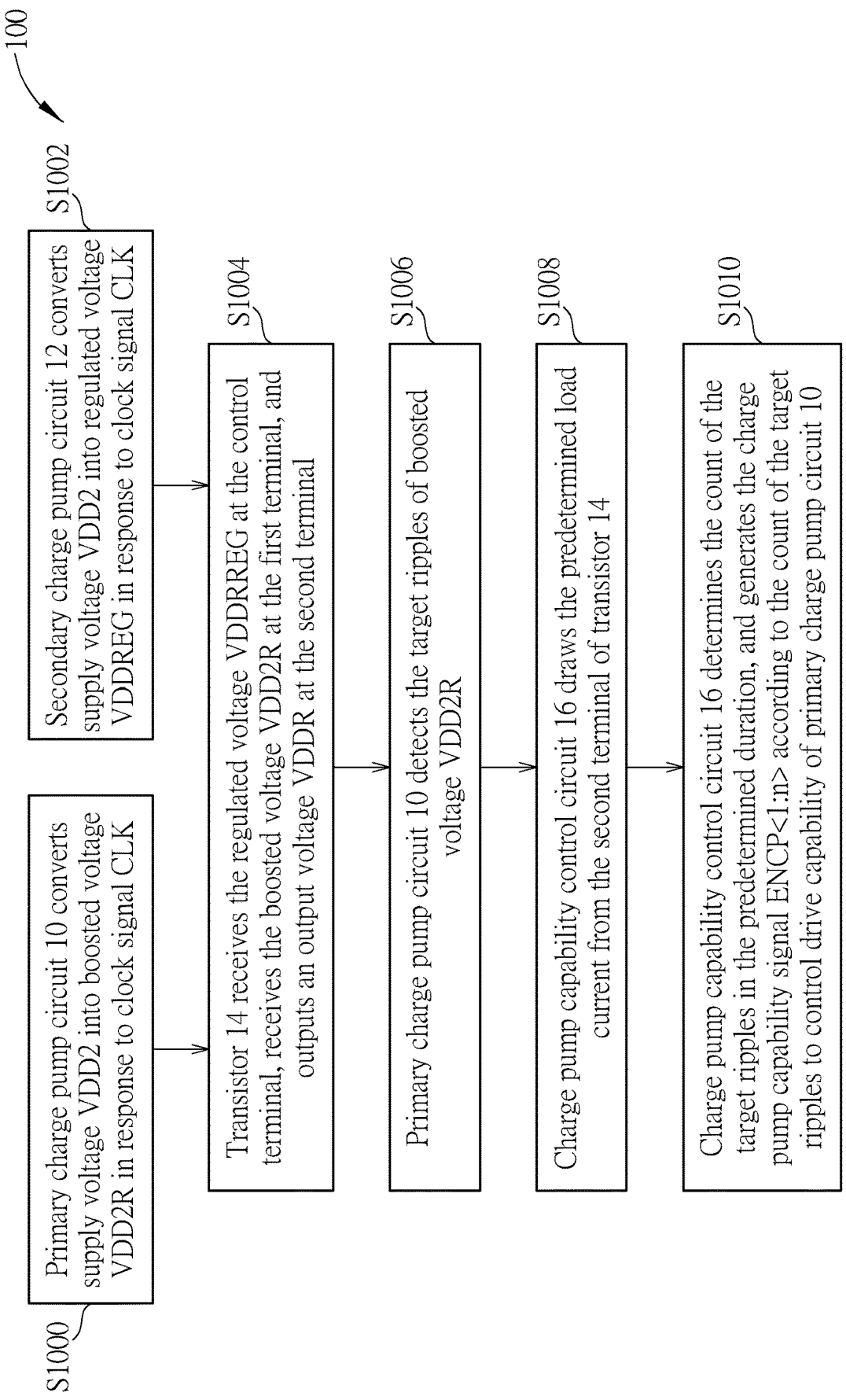
FIG. 10 is a flowchart of a method of controlling the voltage booster circuit in FIG. 1.

FIG. 10 is a flowchart of a method 100 of controlling the voltage booster circuit 1. The method 100 comprises Steps S1000 to S1010. Steps S1000 to S1004 are used to reduce the ripple voltage in the output voltage VDDR using the source follower. Steps S1006 to S1010 are used to select sufficient drive capability for the primary charge pump circuit 10, thereby further controlling the ripple voltage in the output voltage VDDR. Any reasonable technological change or step adjustment is within the scope of the disclosure. Steps S1000 to S1010 are provided as follows:

Step S1000: Primary charge pump circuit 10 converts supply voltage VDD2 into boosted voltage VDD2R in response to clock signal CLK;

Step S1002: Secondary charge pump circuit 12 converts supply voltage VDD2 into regulated voltage VDDREG in response to clock signal CLK;

Step S1004: Transistor 14 receives the regulated voltage VDDRREG at the control terminal, receives the boosted voltage VDD2R at the first terminal, and outputs an output voltage VDDR at the second terminal;

Step S1006: Primary charge pump circuit 10 detects the target ripples of boosted voltage VDD2R;

Step S1008: Charge pump capability control circuit 16 draws the predetermined load current from the second terminal of transistor 14;

Step S1010: Charge pump capability control circuit 16 determines the count of the target ripples in the predetermined duration, and generates the charge pump capability signal ENCP<1:n> according to the count of the target ripples to control drive capability of primary charge pump circuit 10.

Steps S1000 to S1010 are explained in detail in the preceding paragraphs, and explanation therefor is omitted for brevity. The method 100 is used to control the transistor 14 and the charge pump capability control circuit 16 of the voltage booster circuit 1 to reduce the ripple voltage in the output voltage VDDR while providing sufficient drive capability to drive the connected load.

The embodiments in FIGS. 1 to 10 provide a voltage booster circuit with ripple control and a method controlling the same, reducing ripple voltage in the output voltage, preventing circuit components from being damaged by a very high output voltage, and enhancing circuit performance by producing an output voltage sufficient to drive a load.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage booster circuit comprising:
   a primary charge pump circuit configured to convert a supply voltage into a boosted voltage in response to a clock signal and detect target ripples, the target ripples being ripples of the boosted voltage oscillating about a reference voltage level;
   a secondary charge pump circuit configured to convert the supply voltage into a regulated voltage in response to the clock signal;
   a transistor coupled to the primary charge pump circuit and the secondary charge pump circuit, having a control terminal receiving the regulated voltage, a first terminal receiving the boosted voltage and a second terminal outputting an output voltage; and
   a charge pump capability control circuit, coupled to the primary charge pump circuit and the transistor, and configured to draw a predetermined load current from the second terminal of the transistor, determine a count of the target ripples in a predetermined duration, and generate a charge pump capability signal according to the count of the target ripples to control drive capability of the primary charge pump circuit.

2. The voltage booster circuit of claim 1, wherein the charge pump capability control circuit comprises:
   a current load coupled to the transistor, and configured to draw the predetermined load current from the second terminal of the transistor according to a current load enabling signal;
   a time counter coupled to the current load, and configured to measure an initialization duration and the predetermined duration;
   a stop counter coupled to the time counter and the primary charge pump circuit, and configured to determine whether the count of the target ripples has reached a predetermined ripple count in the predetermined duration; and
   a latch circuit coupled to the time counter and the primary charge pump circuit, and configured to generate the current load enabling signal upon expiry of the initialization duration and update the charge pump capability signal to increase the drive capability of the primary charge pump circuit if the count of the target ripples has not reached the predetermined ripple count upon expiry of the predetermined duration;
   wherein the initialization duration precedes the predetermined duration in time.

3. The voltage booster circuit of claim 2, wherein the stop counter comprises:
   a first AND gate configured to receive an enabling signal and a comparison signal to accordingly generate an AND output signal;
   a plurality of first cascading flip-flops coupled to the AND gate, and configured to generate the count of the target ripples according to the AND output signal;
   a second AND gate coupled to the plurality of first cascading flip-flops, and configured to determine whether the count of the target ripples has reached the predetermined ripple count; and
   an output flip-flop coupled to the second AND gate, and configured to flag a stop signal when the count of the target ripples has reached the predetermined ripple count.

4. The voltage booster circuit of claim 3, wherein the time counter comprises:
   a 3-input NAND gate configured to receive the enabling signal, the clock signal and the stop signal to accordingly generate a gated clock signal; and
   a plurality of second cascading flip-flops coupled to the 3-input AND gate, and configured to measure the initialization duration and the predetermined duration according to the gated clock signal, and generate a timeout signal indicative of the expiry of the initialization duration and the expiry of the predetermined duration.

5. The voltage booster circuit of claim 4, wherein the latch circuit comprises:
   a plurality of third cascading flip-flops coupled to the plurality of second cascading flip-flops, and configured to generate the current load enabling signal and the charge pump capability signal according to the timeout signal.

6. The voltage booster circuit of claim 1, wherein the primary charge pump circuit comprises a plurality of charge pump stages coupled to each other and coupled to the charge pump capability control circuit, and is configured to receive the charge pump capability signal to determine which of the charge pump stages is to be selected.

7. The voltage booster circuit of claim 6, wherein the primary charge pump circuit further comprises a plurality of delays and buffers respectively coupled to the plurality of charge pump stages, and configured to control timings of enabling the plurality of charge pump stages, respectively.

8. The voltage booster circuit of claim 6, wherein:
   the primary charge pump circuit further comprises a comparator configured to compare a portion of the boosted voltage to a comparator reference voltage level to generate a comparison signal indicative of detection of the target ripples in the boosted voltage; and
   a selected number of the charge pump stages are enabled when the portion of the boosted voltage is less than the comparator reference voltage level and disabled when the portion of the boosted voltage exceeds the comparator reference voltage level.

9. The voltage booster circuit of claim 1, wherein the secondary charge pump circuit comprises:
   a buffer;
   a charge pump stage, coupled to the buffer, and configured to convert the supply voltage into the regulated voltage in response to the clock signal; and
   a comparator, coupled to the charge pump stage, and configured to compare a portion of the regulated voltage to a comparator reference voltage level;
   wherein the charge pump stage is enabled when the portion of the regulated voltage is less than the comparator reference voltage level and the charge pump stage is disabled when the portion of the regulated voltage exceeds the comparator reference voltage level.

10. A voltage booster circuit comprising:
    a primary charge pump circuit configured to convert a supply voltage into a boosted voltage in response to a clock signal;

a secondary charge pump circuit configured to convert the supply voltage into a regulated voltage in response to the clock signal; and a transistor coupled to the primary charge pump circuit and the secondary charge pump circuit, having a control terminal receiving the regulated voltage, a first terminal receiving the boosted voltage and a second terminal outputting an output voltage;

wherein the transistor is a native NMOS transistor.

11. A method of controlling a voltage booster circuit, the method comprising:

a primary charge pump circuit converting a supply voltage into a boosted voltage in response to a clock signal;

a secondary charge pump circuit converting the supply voltage into a regulated voltage in response to the clock signal; and a native NMOS transistor receiving the regulated voltage at a control terminal, receiving the boosted voltage at a first terminal, and outputting an output voltage at a second terminal.

12. The method of claim 11, further comprising:

the primary charge pump circuit detecting target ripples, the target ripples being ripples of the boosted voltage oscillating about a reference voltage level;

a charge pump capability control circuit drawing a predetermined load current from the second terminal of the transistor;

the charge pump capability control circuit determining a count of the target ripples in a predetermined duration; and the charge pump capability control circuit generating a charge pump capability signal according to the count of the target ripples to control drive capability of the primary charge pump circuit.

13. The method of claim 12, wherein:

the charge pump capability control circuit drawing the predetermined load current from the second terminal of the transistor comprises:

a current load of the charge pump capability control circuit drawing the predetermined load current from the second terminal of the transistor according to a current load enabling signal;

the charge pump capability control circuit determining the count of the target ripples in the predetermined duration comprises:

a time counter of the charge pump capability control circuit measuring an initialization duration and the predetermined duration, the initialization duration preceding the predetermined duration in time; and a stop counter of the charge pump capability control circuit determining the count of the target ripples; and the charge pump capability control circuit generating the charge pump capability signal comprises:

the stop counter of the charge pump capability control circuit determining whether the count of the target ripples has reached a predetermined ripple count in the predetermined duration; and a latch circuit of the charge pump capability control circuit generating the current load enabling signal upon expiry of the initialization duration and updating the charge pump capability signal to increase the drive capability of the primary charge pump circuit if the count of the target ripples has not reached the predetermined ripple count upon expiry of the predetermined duration.

14. The method of claim 12, wherein:

the primary charge pump circuit comprises a plurality of charge pump stages; and the method further comprises:

the primary charge pump circuit receiving the charge pump capability signal to determine which of the charge pump stages is to be selected.

15. The method of claim 14, further comprising:

a plurality of delays and buffers of the primary charge pump circuit controlling timings of enabling the plurality of charge pump stages, respectively.

16. The method of claim 14, further comprising:

a comparator of the primary charge pump circuit comparing a portion of the boosted voltage to a comparator reference voltage level to generate a comparison signal indicative of detection of the target ripples in the boosted voltage; and enabling the plurality of charge pump stages when the portion of the boosted voltage is less than the comparator reference voltage level.

17. The method of claim 14, further comprising:

a comparator of the primary charge pump circuit comparing a portion of the boosted voltage to a comparator reference voltage level to generate a comparison signal indicative of detection of the target ripples in the boosted voltage; and disabling the plurality of charge pump stages when the portion of the boosted voltage exceeds the comparator reference voltage level.

18. The method of claim 11, wherein the secondary charge pump circuit converting the supply voltage into the regulated voltage in response to the clock signal comprises:

a charge pump stage of the secondary charge pump circuit converting the supply voltage into the regulated voltage in response to the clock signal.

19. The method of claim 18, further comprises:

a comparator of the secondary charge pump circuit comparing a portion of the regulated voltage to a comparator reference voltage level to generate a comparison signal; and controlling the charge pump stage of the secondary charge pump circuit according to the comparison signal.

* * * * *